US010845380B2

(12) United States Patent
Eid et al.

(10) Patent No.: US 10,845,380 B2
(45) Date of Patent: Nov. 24, 2020

(54) MICROELECTRONIC DEVICES FOR ISOLATING DRIVE AND SENSE SIGNALS OF SENSING DEVICES

(71) Applicant: Intel Corporation, Santa Clara, CA (US)

(72) Inventors: Feras Eid, Chandler, AZ (US); Henning Braunisch, Phoenix, AZ (US); Georgios C. Dogiamis, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 15/771,869

(22) PCT Filed: Dec. 17, 2015

(86) PCT No.: PCT/US2015/066523
§ 371 (c)(1),
(2) Date: Apr. 27, 2018

(87) PCT Pub. No.: WO2017/105472
PCT Pub. Date: Jun. 22, 2017

(65) Prior Publication Data
US 2018/0328957 A1    Nov. 15, 2018

(51) Int. Cl.
*G01P 15/097*    (2006.01)
*G01P 15/105*    (2006.01)
(Continued)

(52) U.S. Cl.
CPC ......... *G01P 15/097* (2013.01); *B81B 7/0006* (2013.01); *B81C 1/0023* (2013.01);
(Continued)

(58) Field of Classification Search
CPC ...... G01P 15/097; G01P 15/105; G01P 15/11; G01P 15/123; G01P 15/0802
See application file for complete search history.

(56) References Cited

U.S. PATENT DOCUMENTS 6,888,662 B2 * 5/2005 Abu-Ageel ............ H02N 1/002
310/309
7,977,137 B1 * 7/2011 Ebel ...................... B81B 7/0064
200/181

(Continued)

FOREIGN PATENT DOCUMENTS

JP    2004-354109    12/2004

OTHER PUBLICATIONS

International Search Report and Written Opinion for International Patent Application No. PCT/US2015/066523 dated Aug. 19, 2016, 17pgs.

(Continued)

*Primary Examiner* — Helen C Kwok
(74) *Attorney, Agent, or Firm* — Schwabe, Williamson & Wyatt, P.C.

(57) ABSTRACT

Embodiments of the invention include a microelectronic device having a sensing device and methods of forming the sensing device. In an embodiment, the sensing device includes a mass and a plurality of beams to suspend the mass. Each beam comprises first and second conductive layers and an insulating layer positioned between the first and second conductive layers to electrically isolate the first and second conductive layers. The first conductive layer is associated with drive signals and the second conductive layer is associated with sense signals of the sensing device.

16 Claims, 5 Drawing Sheets

(51) Int. Cl.
  *G01P 15/08* (2006.01)
  *B81C 1/00* (2006.01)
  *B81B 7/00* (2006.01)
(52) U.S. Cl.
  CPC ...... *B81C 1/00166* (2013.01); *G01P 15/0802* (2013.01); *G01P 15/105* (2013.01); *B81B 2201/0235* (2013.01); *B81B 2201/0242* (2013.01); *B81B 2203/0118* (2013.01); *B81B 2203/04* (2013.01); *B81B 2203/053* (2013.01); *B81B 2207/012* (2013.01); *B81B 2207/07* (2013.01)

(56) References Cited

U.S. PATENT DOCUMENTS

| | | | | |
|---|---|---|---|---|
| 8,450,913 | B1* | 5/2013 | Ayazi | H03H 9/02409 310/328 |
| 2002/0017134 | A1* | 2/2002 | Sakurai | G01P 15/0802 73/504.02 |
| 2009/0173156 | A1* | 7/2009 | Takaoka | G01C 19/5656 73/504.12 |
| 2012/0074818 | A1* | 3/2012 | Crowley | G01S 19/49 310/348 |
| 2012/0235257 | A1* | 9/2012 | Yoshida | G01L 1/106 257/418 |
| 2014/0190257 | A1* | 7/2014 | Zhang | B81B 5/00 73/504.12 |
| 2014/0321093 | A1* | 10/2014 | Pande | H01G 11/22 361/807 |
| 2015/0135833 | A1* | 5/2015 | Ishida | H01L 41/0815 73/514.34 |
| 2018/0017386 | A1* | 1/2018 | Mitani | H01L 41/047 |

OTHER PUBLICATIONS

International Preliminary Report on Patentability for International Patent Application No. PCT/US2015/066523, dated Jun. 28, 2018, 17 pages.

* cited by examiner

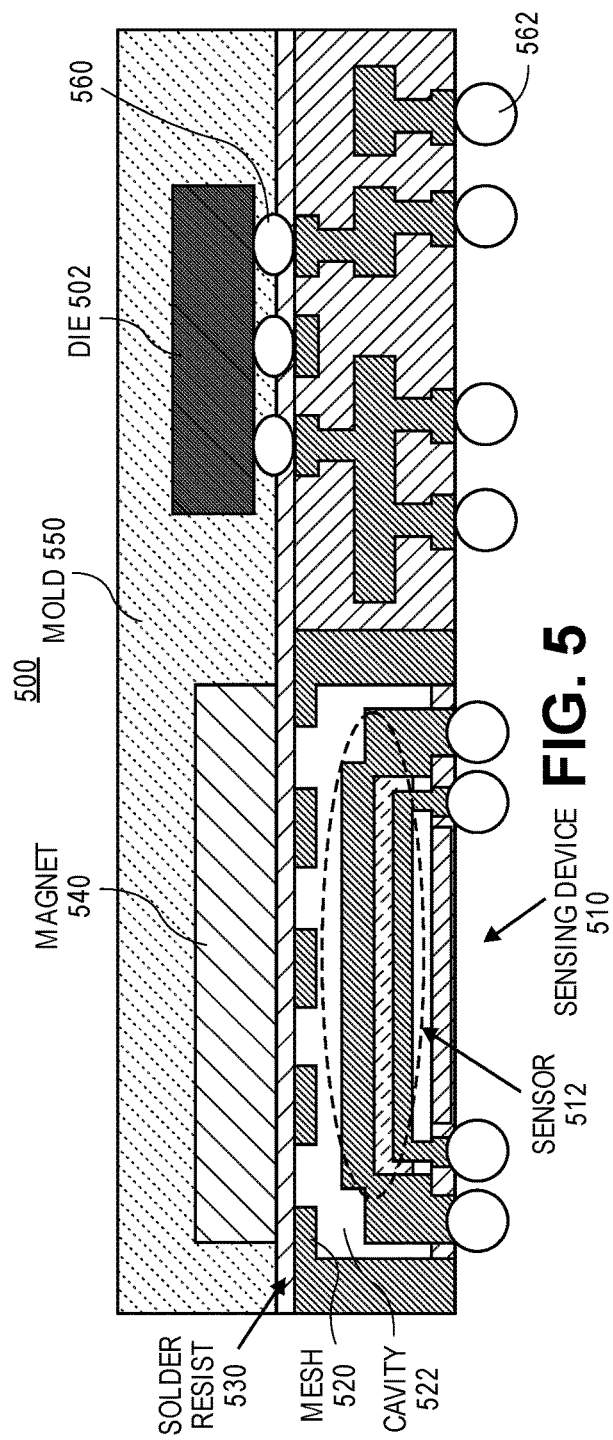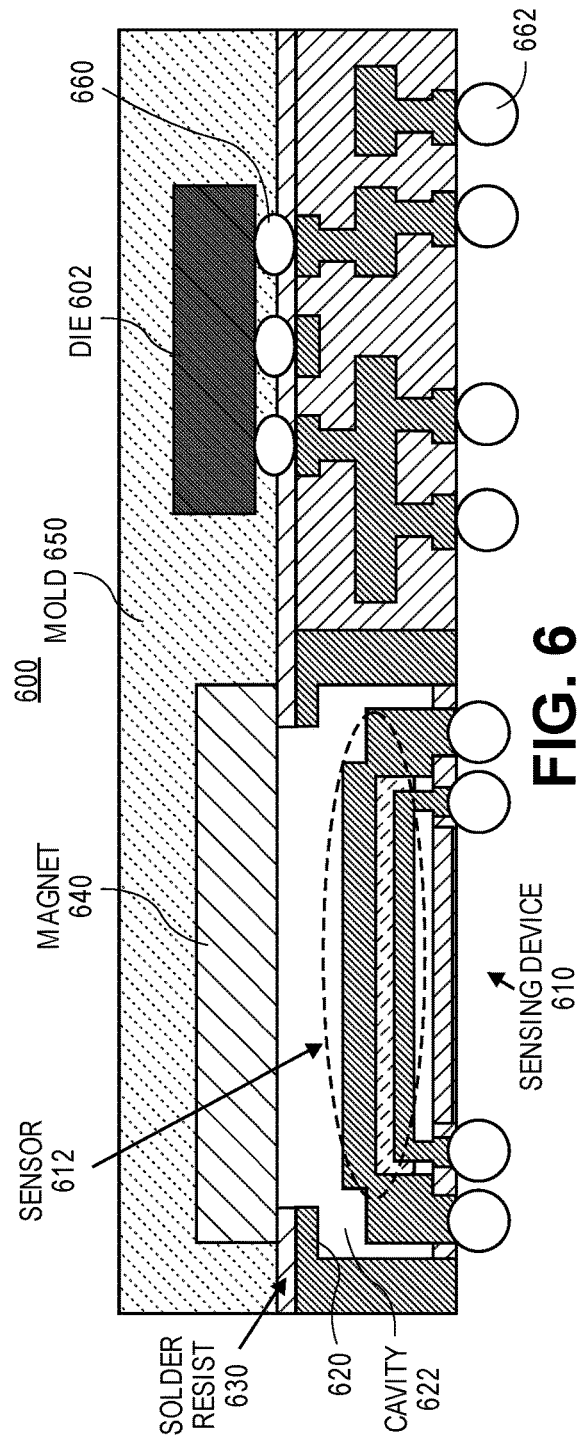

MICROELECTRONIC DEVICES FOR ISOLATING DRIVE AND SENSE SIGNALS OF SENSING DEVICES

CROSS-REFERENCE TO RELATED APPLICATION

This patent application is a U.S. National Phase Application under 35 U.S.C. § 371 of International Application No. PCT/US2015/066523, filed Dec. 17, 2015, entitled "MICROELECTRONIC DEVICES FOR ISOLATING DRIVE AND SENSE SIGNALS OF SENSING DEVICES," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices for isolating drive and sense signals of package integrated resonant sensing devices.

BACKGROUND OF THE INVENTION

A variety of different types of sensors are being used in portable and mobile devices. These sensors extend beyond microphones and radio receivers to accelerometers, gyroscopes, compasses, altimeters, barometers and more. For some special purpose-built devices biometric or environmental sensors are used for medical or scientific purposes.

As miniaturization advances, there are efforts to construct sensors within smaller packages. In some cases, a sensor or a suite of sensors may be packaged together in a manner similar to an integrated circuit chip package. In other cases, sensors are combined with integrated circuits in a single package. The sensor or suite of sensors may be difficult to package in a chip package or a single package.

BRIEF DESCRIPTION OF THE DRAWINGS

FIG. 5 illustrates a package substrate configuration (e.g., microelectronic device) having a sensing device in accordance with one embodiment.

FIG. 6 illustrates a package substrate configuration (e.g., microelectronic device) having a sensing device in accordance with one embodiment.

DETAILED DESCRIPTION OF THE INVENTION

Described herein are microelectronic devices that include sensing devices and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include a sensing device and methods of forming a sensing device. In an embodiment, the sensing device includes a mass and a plurality of beams to suspend the mass. Each beam comprises first and second conductive layers and an insulating layer positioned between the first and second conductive layers to electrically isolate the first and second conductive layers. The first conductive layer is associated with drive signals and the second conductive layer is associated with sense signals of the sensing device.

Figure 1:
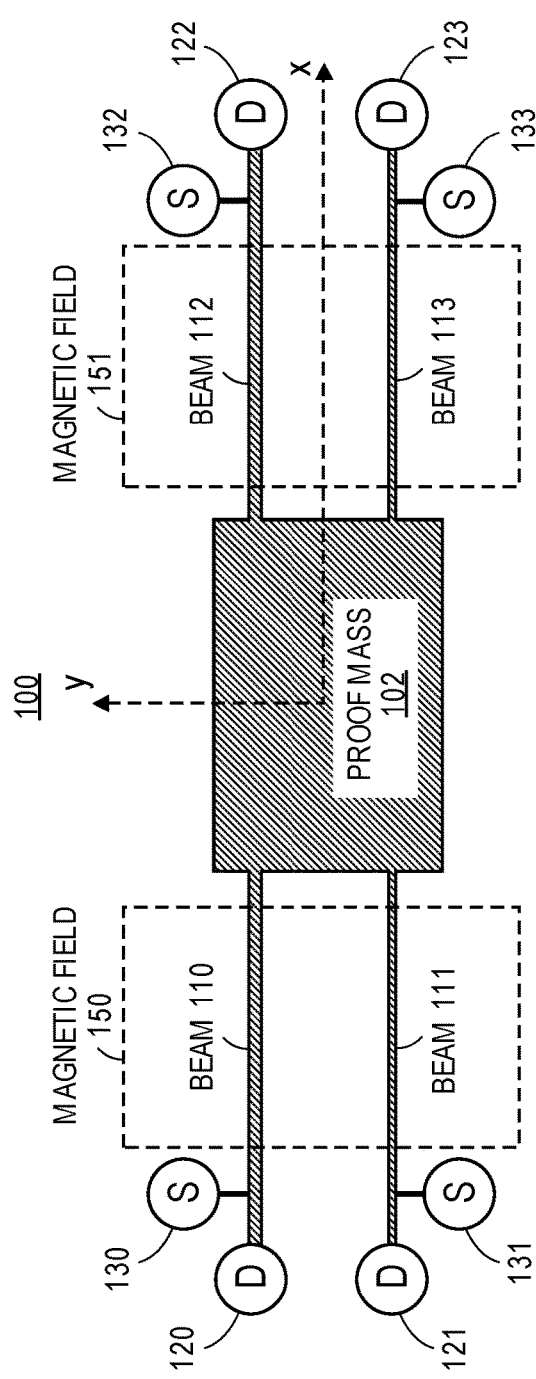
FIG. 1, a top view of a sensing device 100 is shown, according to an embodiment.

Referring now to FIG. 1, a top view of a sensing device 100 is shown, according to an embodiment. In one example, the sensing device 100 is a package integrated resonant sensing device (e.g., accelerometer). In another example, the sensing device can be a different type of sensor (e.g., gyroscope, temperature, gas concentration). The sensing device 100 includes beams 110-113 coupled or attached to a proof mass 102 at one end and anchored to vias (e.g., drive vias 120-123, sense vias 130-133) that provide electrical connections at the other end. The beams and proof mass are released and thus free to move up and down in a vertical Y direction of FIG. 1. The beams remain anchored to the vias. In one example, a permanent magnet is used to provide magnetic fields 150 and 151. To operate the device, an AC current is used to drive a moveable portion of each beam into mechanical resonance under the influence of the magnetic field. The beam then generates its own induced emf (e.g., at beams 112, 113) at the same resonant frequency due to motion in the magnetic field. When an external acceleration is applied, the proof mass 102 is displaced, inducing tension in the beam which changes the beam's resonant frequency. By measuring the emf, the change in resonant frequency and hence the applied acceleration can be determined. In one example, drive signals applied to the beams with drive vias cause the beams to resonate at a first frequency and generate an induced emf at the first frequency. An applied acceleration can cause tension in the beams which changes the resonant frequency of the beams to a second frequency.

A prior approach uses the same resonant trace for supplying the driving signal and sensing the induced emf. However, the problem with this approach is that at resonance the driving voltage (e.g., IR (current times resistance)) and the induced emf are in phase, which means the signals from both are added on top of each other. For a representative design, the generated emf is on the order of 10-15 microvolts (μV) and the drive voltage is on the order of 1-5 millivolts (mV) prior to any amplification. To be able to accurately capture changes in the emf and correlate them to changes in resonant frequency and hence applied acceleration, the driving IR signal thus needs to be controlled to less than 0.1%, to guarantee that any changes in the total signal are coming from changes in the emf only. This is challenging due to fabrication tolerances which produce large variations in the value of resistance of the beams (e.g., up to 30% variation) in addition to noise-induced fluctuations in the value of current. Therefore, this prior approach requires very involved circuitry with state of the art components such as low-noise amplifiers and potentially high power consumption. Additionally, the prior approach would require very precise fabrication process control, which increases the cost of manufacturing and presents an obstacle for successfully implementing those sensors.

An approach to extract the sense signal accurately, if the drive and sense signals are coupled, is to utilize a cancellation technique by providing the exact amount of the drive signal (e.g., calibration signal) at the input of a differential low-noise amplifier (e.g., summing amplifier configuration). As noted above, in one example, the drive signal (IR) and the sense signal (emf) have 1-5 mV and 10-15 µV peak to peak amplitudes respectively. Therefore, the cancellation technique needs to be at least 0.1% accurate, for the cancellation error to be 20 dB less than the sense signal amplitude. However, any small amplitude and phase mismatch (of >0.1%) would suffice to render the cancellation technique inaccurate. Moreover, the fact that the primary driving signal is a current and the calibration signal is a voltage (V=IR, where R is the beam or sensor resistance) gives an additional mismatch parameter, since the sensor resistance is unknown and due to fabrication tolerances varies up to 30%. This large amount of tolerance does not allow the use of dummy sensor structures in order to turn a calibration current into the needed calibration voltage. Therefore, elaborate mixed-signal circuits are employed in order to overcome these drawbacks. First, a digital circuit is needed to successively approximate the resistance of the sensor R and store its digital value. Then, a variable gain amplifier adapts its gain (according to the stored R) and supplies the calibration voltage. Here, extra care has to be taken to keep the phase shift extremely small at the frequency of interest between drive and calibration signal. Moreover, low-noise temperature-stabilized voltage references have to be shared among all circuit components to achieve a good cancellation. Hence, in order to overcome these issues both digital and analog blocks are needed, increasing the size and power of the read out interface circuit.

Figure 2:
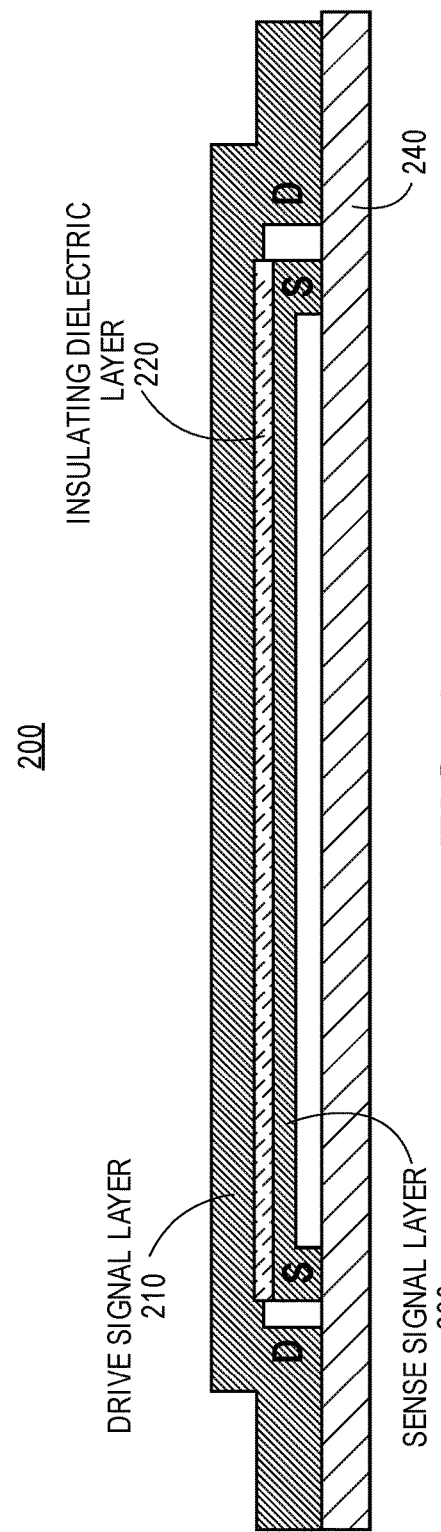
FIG. 2 illustrates a side view of a sensing device 200 in accordance with one embodiment.

The present design proposes decoupling the drive and sense signals with an insulating layer to avoid the above mentioned difficulties of the prior approach and the cancellation technique. FIG. 2 illustrates a side view of a sensing device 200 in accordance with one embodiment. The driving signal layer 210 and sense signal layer 230 are conductive (e.g., metal) layers that are electrically isolated by means of an insulating inorganic dielectric layer 220. The three layers are still mechanically coupled however and vibrate as a single structure with one resonant frequency. In this manner, one of the metal layers can be used to accommodate the driving current, causing the entire structure to resonate. The emf induced in the other metal layer is then measured or sensed with substantially no interference from the driving IR signal.

When the drive and sense signals are decoupled as illustrated in FIG. 2, the above mentioned circuit components of the prior approach and cancellation technique are not needed. Since the driving voltage is now decoupled from the sense signal (emf), the interface circuit only comprises of a low-noise amplifier. This assumes that any electromagnetic coupling between the driving beam and the sensing beam is negligible. This is a very reasonable assumption based on the following estimation. In one example, assuming a dielectric thickness of 0.1 µm and a driving current of 1 mA with operation at 20 kHz resonance frequency the capacitive coupling across the dielectric (e.g., SiN) layer is more than five orders of magnitude smaller than the actual sense signal (emf). Also, inductive coupling with mutual inductance of no more than 1 nH is at least two orders of magnitude smaller than the sense signal. This shows that the drive and sense signals can be fully decoupled with the proposed structure and hence all additional mixed-signal circuit calibration techniques can be safely omitted.

The novelty in this present design architecture lies in the use of a dielectric material to decouple the drive and sense signals while mechanically coupling the traces (conductive layers or paths) that deliver those signals in a package integrated resonant sensing device. The dielectric material used can be any inorganic dielectric such as SiN, SiOx, SiNOx, etc. that is not etched away by (or has a substantially lower etch rate than) the plasma etchant used to remove the organic layers and create a cavity for the sensing device.

Figure 3A:
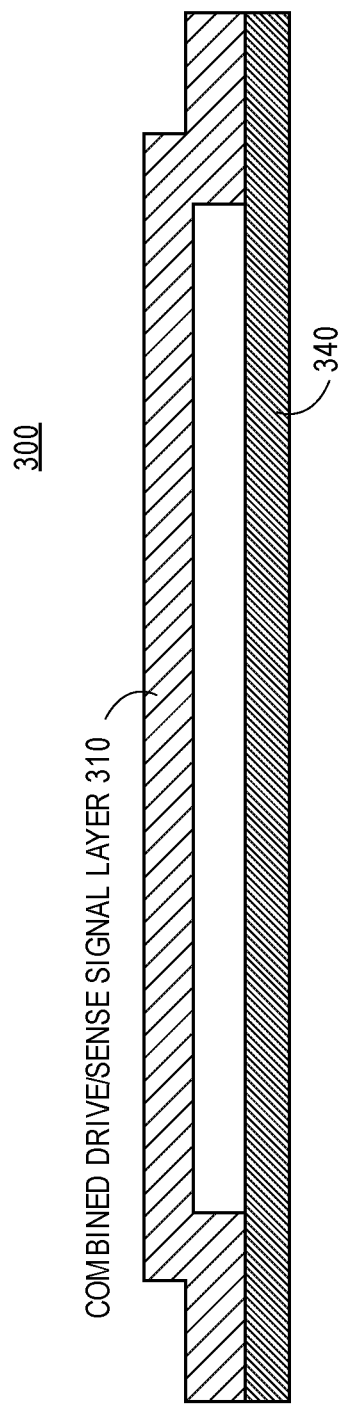
FIG. 3A illustrates a sensing device with no insulating layer and FIG. 3B illustrates a sensing device having an insulating layer interposed between drive and sense layers in accordance with one embodiment.
Figure 3B:
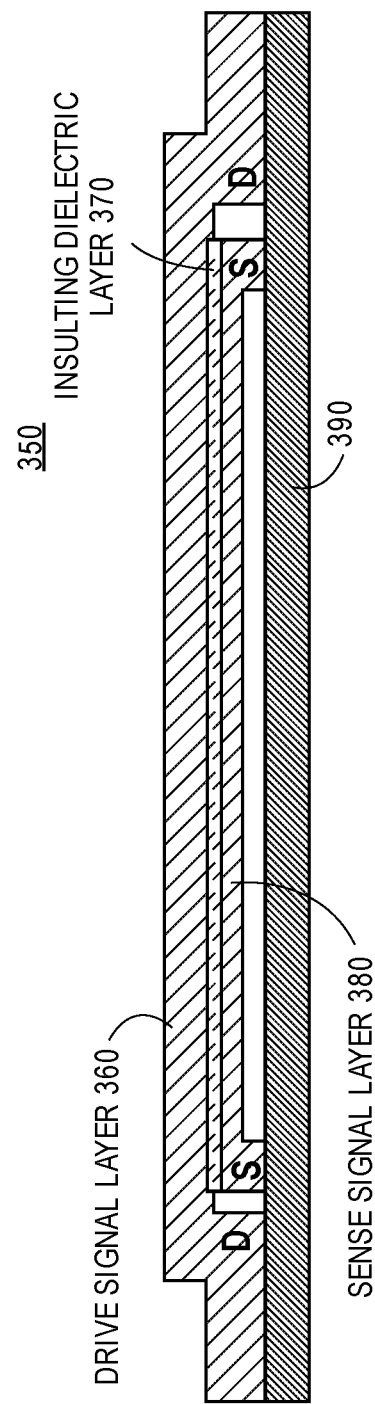

One embodiment may feature a sense signal layer that is substantially thinner than the drive signal layer, because a thicker drive signal layer is preferred for reduced resistance and lower power consumption while the sense signal layer can be kept thin for high-impedance voltage sensing. As a result, the mechanical performance of the sensing device 350 having an insulating layer 370 interposed between drive signal layer 360 and sense signal layer 380 as illustrated in FIG. 3B is similar to that of a sensing device 300 having a single combined drive/sense layer 310 as illustrated in FIG. 3A with no interposed insulation layer in accordance with one embodiment. The sensing device 300 includes one or more organic build up layers 340. The sensing device 350 includes one or more organic build up layers 390. Finite element analysis (FEA) simulations carried out on devices 300 and 350 indicate that the frequencies of the two devices are very close (e.g., 19.9 kHz in FIG. 3A, 20.1 kHz in FIG. 3B). Having similar mechanical performance is desirable because the mechanics of the design with no insulating layer were optimized to produce a fast response and high sensitivity to acceleration changes. In the simulation that was used to generate the above numbers, a 0.2 µm thick SiN layer (e.g., insulating dielectric layer 370) is used for isolation in the sensing device of FIG. 3B. The thicknesses of the drive and sense traces are approximately 14 µm and 0.8 µm, respectively, which are characteristic values for the process flow outlined below. The sensor layer thickness in the sensing device with no insulating layer is approximately 15 µm.

In one example, the drive layer has a thickness of 13-15 µm, the sense layer has a thickness of 0.6 to 1.2 µm, and the dielectric isolation layer has a thickness of 50 to 200 nanometers.

FIGS. 4A-4F illustrate a process for manufacturing a sensing device in accordance with one embodiment. In principle, the illustrated layering may be varied. For example, additional layers may be interspersed, containing dielectrics, functional layers, or other components for other microelectronic devices present on the common substrate. Likewise, certain of the illustrated layers (for example layers underlying the sensing device components) may or may not be present in a device that is nonetheless in accordance with embodiments.

Figure 4A:
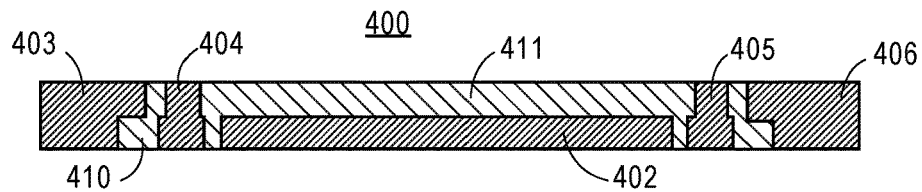
FIGS. 4A-4F illustrate a process for manufacturing a sensing device in accordance with one embodiment.

FIG. 4A illustrates a substrate 400 of a sensing device in accordance with one embodiment. The substrate may be a copper plate or other substrate including, without limitation, glass or organic material. For use in build up layer applications, any substrate suitable for use in that technology may be used. A substrate 400 includes one or more conductive metal layers 402-406 and one or more organic build up layers 410 and 411.

Figure 4B:
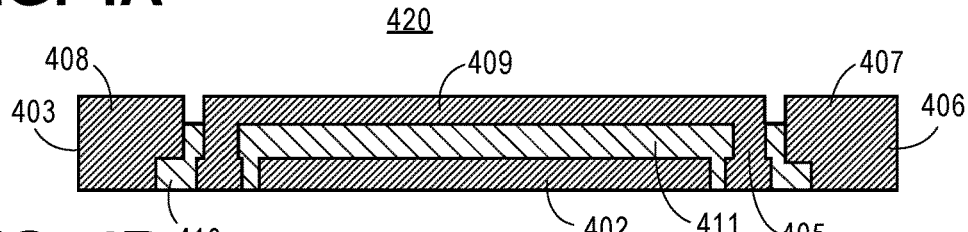

FIG. 4B illustrates a substrate 420 of a sensing device having a sensing layer in accordance with one embodiment. The substrate 420 includes similar layers as illustrated in FIG. 4A and additionally includes one or more conductive metal layers 407-409. The layers 407 and 408 form electrical connections for a drive layer and the layer 409 is the sense layer of the sensing device. In one example, an electroless copper layer is deposited and patterned in order to form the layers 407-409.

Figure 4C:
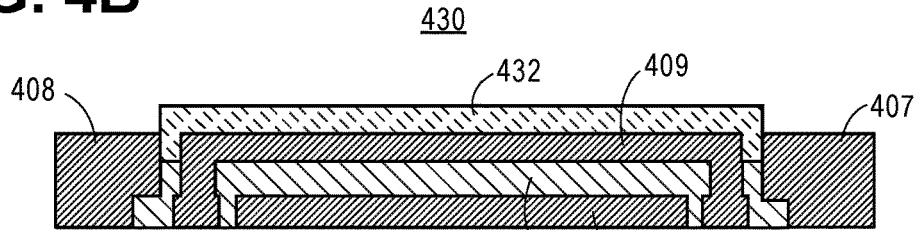

FIG. 4C illustrates a substrate 430 of a sensing device having a sensing layer and an isolation layer in accordance with one embodiment. The substrate 430 includes similar layers as illustrated in FIG. 4B and additionally includes the isolation layer 432 that is formed by depositing the isolation layer, patterning the isolation layer, and etching unmasked portions. The layers 407 and 408 form electrical connections for a drive layer and the layer 409 is the sense layer of the sensing device. In one example, the isolation layer 432 is formed with an inorganic dielectric (e.g., SiN, etc.) to isolate the sense layer from a drive layer that is deposited on the isolation layer.

Figure 4D:
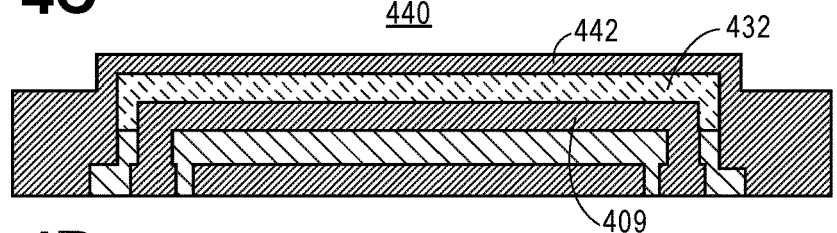

FIG. 4D illustrates a substrate 440 of a sensing device having a sensing layer, an isolation layer, and a seed layer 442 of a drive layer in accordance with one embodiment. The substrate 440 includes similar layers as illustrated in FIG. 4C and additionally includes a seed layer 442 of a drive layer.

Figure 4E:
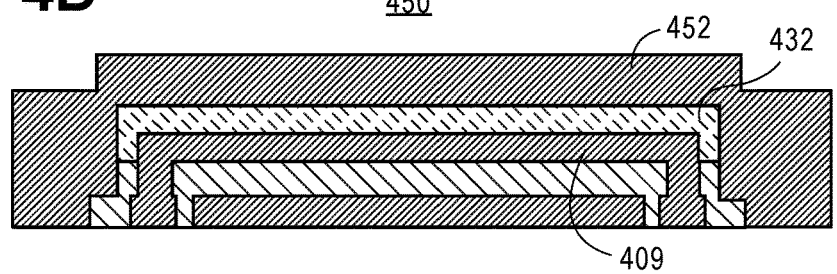

FIG. 4E illustrates a substrate 450 of a sensing device having a sensing layer, an isolation layer, and a drive layer 452 in accordance with one embodiment. In one example, the process includes laminating and patterning a dry film resist layer and electroplating drive traces of the drive layer 452. Then, the dry film resist layer is removed and a flash etch of the seed layer is performed. The isolation layer 432 decouples and electrically isolates the drive layer 452 from the sense layer 409 of the sensing device.

Figure 4F:
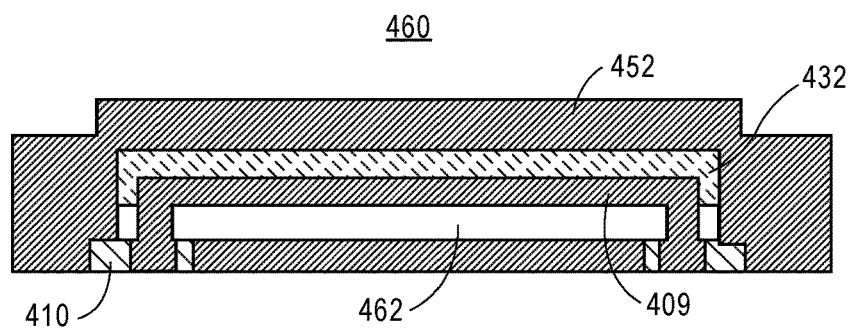

FIG. 4F illustrates a substrate 460 of a sensing device having a sensing layer, an isolation layer, and a drive layer 452 in accordance with one embodiment. In one example, the process includes a plasma etch for removing one or more organic build up layers. In this example, the organic build up layer 411 is etched leaving an air gap 462 while the organic build up layer 410 is not substantially etched.

FIG. 5 illustrates a package substrate configuration (e.g., microelectronic device) having a sensing device in accordance with one embodiment. The microelectronic device 500 includes a sensing device 510 having a sensor 512 with a sandwich sensing structure that includes isolated drive and sense layers as illustrated in FIGS. 4A-4F. A flip-chip (FC) attached die 502 can be any type of circuitry including a CPU or an ASIC used to drive the sensing device 510. The microelectronic device 500 also contains a magnet 540, which is necessary to actuate the sensor. The magnet 540 is attached above the location of the sensor (e.g., to solder resist 530) using epoxy, soldering, or similar materials. A mold 550 forms an upper layer of the device 500. Generally, a sensor protection mesh 520 should be anchored to underlying structures at several locations (not shown) not occupied by the sensing device.

The mesh layer 520 is patterned following the layers of the sensing device. Then these layers are released by etching of the build up film layers. A solder resist layer 530 is then patterned on top of the mesh and used to seal the open mesh areas above the cavity 522.

In one embodiment, the sensing device 510 includes the sensor 512 and the magnet 540. In another embodiment, the sensing device 510 does not include the magnet 540.

FIG. 6 illustrates a package substrate configuration (e.g., microelectronic device) having a sensing device in accordance with one embodiment. The microelectronic device 600 includes a sensing device 610 having a sensor 612 with a sandwich sensing structure with isolated drive and sense layers as illustrated in FIGS. 4A-4F. A flip-chip (FC) attached die 602 can be any type of circuitry including a CPU or an ASIC used to drive the sensing device 610. In FIG. 6, the mesh is replaced by a layer 620 which has an open window above the sensing device. Plasma etching is withheld until after the solder resist is deposited and patterned to open up the window area. Following build up film etching, the magnet is attached and used to seal the cavity.

In one embodiment, the sensing device 610 includes the sensor 612 and the magnet 640. In another embodiment, the sensing device 610 does not include the magnet 640.

A die 502 or 602 is optionally assembled proximate the magnet. This die 502 or 602 may include the control circuitry such as the current source, switch, phase locked loop, differential amplifier, readout circuitry, and/or other related circuitry for controlling and interrogating the accelerometer. As will be appreciated, the die 502 or 602 may include all or none of these circuits, and may include other circuits for performing other functions.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more sensing devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints (e.g., 560, 562, 660, 662) that are each electrically coupled to a contact. The solder bumps or solder joints may be electrically coupled to the contacts by one or more redistribution layers and conductive vias.

Figure 7:
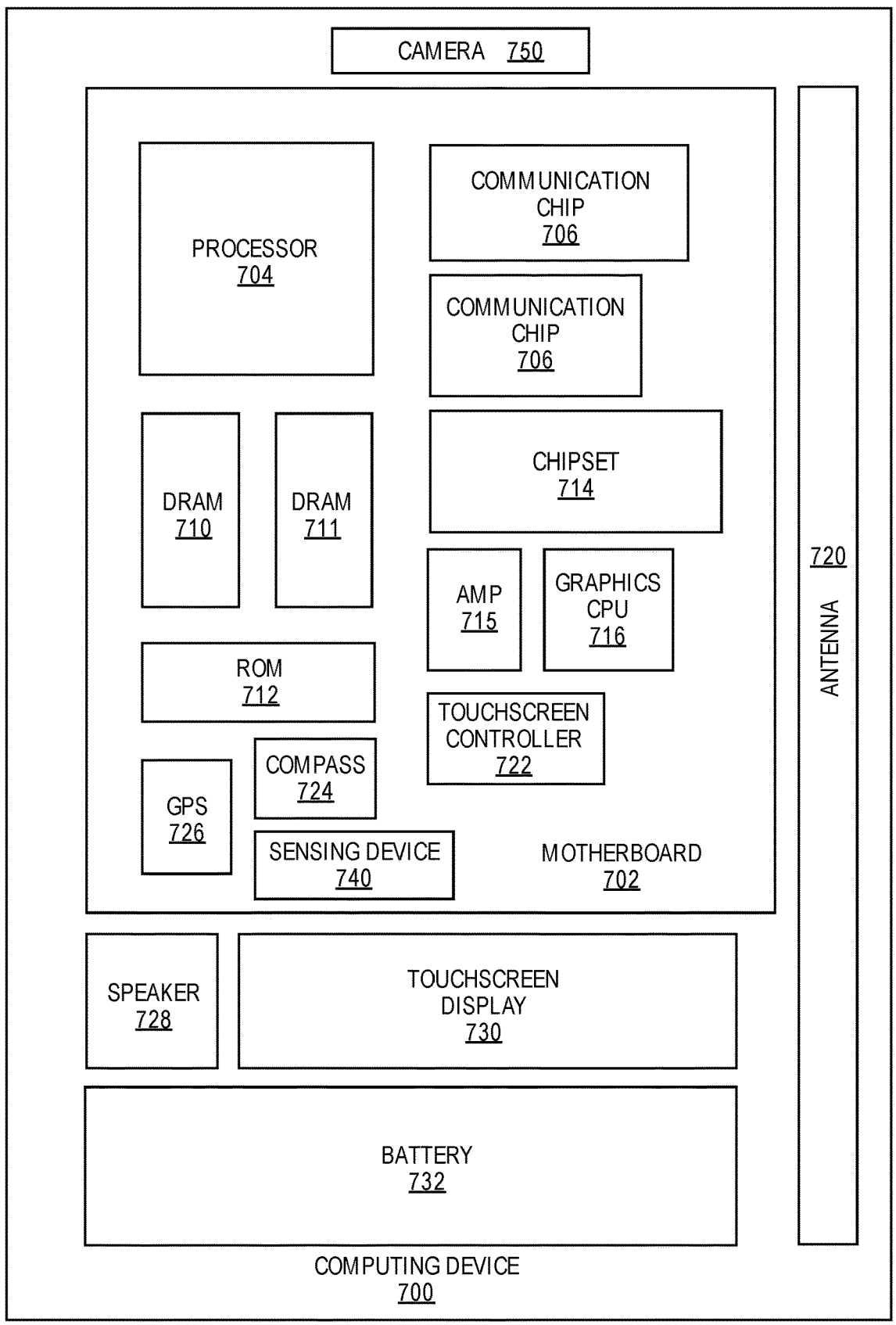
FIG. 7 illustrates a computing device 700 in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM 710, 711), non-volatile memory (e.g., ROM 712), flash memory, a graphics processor 716, a digital signal processor, a crypto processor, a chipset 714, an antenna 720, a display, a touchscreen display 730, a touchscreen controller 722, a battery 732, an audio codec, a video codec, a power amplifier 715, a global positioning system (GPS) device 726, a compass 724, a sensing device 740 (e.g., an accelerometer), a gyroscope, a speaker, a camera 750, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi, WiGig and Bluetooth and a second communication chip 706 may be dedicated to longer range wireless communications such as GPS, EDGE, GPRS, CDMA, WiMAX, LTE, Ev-DO, 5G, and others.

The processor 704 of the computing device 700 includes an integrated circuit die packaged within the processor 704. In some implementations or embodiments of the invention, the integrated circuit die of the processor includes one or more devices, such as sensing devices in accordance with implementations of embodiments of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the invention, the integrated circuit die of the communication chip includes one or more sensing devices.

The following examples pertain to further embodiments. Example 1 is a sensing device that comprises a mass and a plurality of beams to suspend the mass. Each beam comprises first and second conductive layers and an insulating layer positioned between the first and second conductive layers to electrically isolate the first and second conductive layers. The first conductive layer is associated with drive signals and the second conductive layer is associated with sense signals of the sensing device.

In example 2, the subject matter of example 1 can optionally include a magnet, configured and arranged to generate a magnetic field such that, when a time varying signal is applied to the first conductive layer, a characteristic resonant frequency is produced, and when the mass experiences an acceleration, a respective change in the resonant frequency is produced.

In example 3, the subject matter of any of examples 1-2 can optionally include the second conductive layer that measures an induced emf at the resonant frequency or an induced emf at a different frequency upon application of an external acceleration.

In example 4, the subject matter of any of examples 1-3 can optionally include the first conductive layer being mechanically coupled to the insulating layer, which is mechanically coupled to the second conductive layer, in order to vibrate as a single structure with the resonant frequency.

In example 5, the subject matter of any of examples 1-4 can optionally include the plurality of beams and mass including a conductive portion of a package-integrated resonant accelerometer.

In example 6, the subject matter of any of examples 1-5 can optionally include a thickness of the first conductive layer being asymmetric with respect to a thickness of the second conductive layer.

In example 7, the subject matter of any of examples 1-6 can optionally include a thickness of the first conductive layer being substantially greater than a thickness of the second conductive layer.

In example 8, the subject matter of any of examples 1-7 can optionally include the thickness of the insulating layer being less than a thickness of the second conductive layer.

In example 9, the subject matter of any of examples 1-8 can optionally include the sensing device being integrated on a system-on-chip chipset platform.

In example 10, a computing device comprises a sensing device having conductive drive and sense layers that are isolated from each other with an isolation layer and a semiconductor die coupled to the sensing device to control the sensing device.

In example 11, the subject matter of example 10 can optionally include the computing device having a magnet, configured and arranged to generate a magnetic field such that, when a time varying signal is applied to the drive layer, a characteristic resonant frequency is produced, and when a mass of the sensing device experiences an acceleration, a respective change in the resonant frequency is produced.

In example 12, the subject matter of any of examples 10-11 can optionally include the sense layer measuring an induced emf at the resonant frequency or an induced emf at a different frequency upon application of an external acceleration.

In example 13, the subject matter of any of examples 10-12 can optionally include the drive layer that is mechanically coupled to the isolation layer, which is mechanically coupled to the sense layer, in order to vibrate as a single structure with the resonant frequency.

In example 14, the subject matter of any of examples 10-13 can optionally include the computing device having a thickness of the drive layer which is asymmetric with respect to a thickness of the sense layer.

In example 15, the subject matter of any of examples 10-14 can optionally include the computing device having a memory, a display module, and an input module. The memory, display module and input module are in operative communication on a chip chipset platform and each other.

In example 16, the subject matter of any of examples 10-15 can optionally include the computing device having a graphics processor, a communication module and associated antenna, a camera module, a microphone module, and a speaker module. Each of the graphics processor, the communication module, the camera module and the microphone module are in operative communication on a chip chipset platform.

In example 17, a method of manufacturing a sensing device comprises forming a substrate with one or more conductive metal layers and one or more organic build up layers, forming a conductive sense layer of the sensing device, forming an isolation layer, and forming a conductive drive layer. The isolation layer is formed to decouple and electrically isolate the conductive sense layer from the conductive drive layer of the sensing device.

In example 18, the subject matter of example 17 can optionally include removing at least one organic build up layer to form an air gap adjacent to a surface of the conductive sense layer.

In example 19, the subject matter of any of examples 17-18 can optionally include the conductive drive layer that is mechanically coupled to the isolation layer, which is mechanically coupled to the conductive sense layer, in order to vibrate as a single structure with a resonant frequency.

In example 20, the subject matter of any of examples 17-19 can optionally include a thickness of the conductive drive layer that is asymmetric with respect to a thickness of the conductive sense layer.

The invention claimed is:

1. A sensing device comprising:
a mass; and
a plurality of beams to suspend the mass, each beam comprising first and second conductive layers and an insulating layer positioned between the first and second conductive layers to electrically isolate first and second conductive paths, the first conductive layer is associated with drive signals and the second conductive layer is associated with sense signals of the sensing device, wherein the mass comprises the first and second conductive layers and the insulating layer of the plurality of beams.

2. The sensing device of claim 1, further comprising:
a magnet, configured and arranged to generate a magnetic field such that, when a time varying signal is applied to the first conductive layer, a characteristic resonant frequency is produced, and when the mass experiences an acceleration, a respective change in the resonant frequency is produced.

3. The sensing device of claim 2, wherein the second conductive layer is used to measure an induced emf at the resonant frequency or an induced emf at a different frequency upon application of an external acceleration.

4. The sensing device of claim 2, wherein the first conductive layer is mechanically coupled to the insulating layer, which is mechanically coupled to the second conductive layer, in order to vibrate as a single structure with the resonant frequency.

5. The sensing device of claim 1, wherein the plurality of beams and the mass comprise a conductive portion of a package-integrated resonant accelerometer.

6. The sensing device of claim 1, wherein a thickness of the first conductive layer is asymmetric with respect to a thickness of the second conductive layer.

7. The sensing device of claim 1, wherein a thickness of the first conductive layer is substantially greater than a thickness of the second conductive layer.

8. The sensing device of claim 1, wherein a thickness of the insulating layer is less than a thickness of the second conductive layer.

9. The sensing device of claim 1, integrated on a system-on-chip chipset platform.

10. A computing device comprising:
a sensing device having conductive drive and sense layers that are isolated from each other with an isolation layer, and the sensing device having a mass, the mass suspended by a plurality of beams, wherein both the mass and the plurality of beams comprise the conductive drive and sense layers and the isolation layer; and
a semiconductor die coupled to the sensing device to control the sensing device.

11. The computing device of claim 10, further comprising:
a magnet, configured and arranged to generate a magnetic field such that, when a time varying signal is applied to the drive layer, a characteristic resonant frequency is produced, and when the mass of the sensing device experiences an acceleration, a respective change in the resonant frequency is produced.

12. The computing device of claim 11, wherein the sense layer is used to measure an induced emf at the resonant frequency or an induced emf at a different frequency upon application of an external acceleration.

13. The computing device of claim 11, wherein the drive layer is mechanically coupled to the isolation layer, which is mechanically coupled to the sense layer, in order to vibrate as a single structure with the resonant frequency.

14. The computing device of claim 10, wherein a thickness of the drive layer is asymmetric with respect to a thickness of the sense layer.

15. The computing device of claim 10, further comprising:
a memory;
a display module; and
an input module, the memory, the display module and the input module being in operative communication on a chip chipset platform and each other.

16. The computing device of claim 15, further comprising:
a graphics processor;
a communication module and associated antenna;
a camera module;
a microphone module; and
a speaker module, each of the graphics processor, the communication module, the camera module and the microphone module being in operative communication on the chip chipset platform.

* * * * *